United States Patent
Kim

(10) Patent No.: US 11,030,957 B2
(45) Date of Patent: Jun. 8, 2021

(54) ORGANIC LIGHT EMITTING DISPLAY DEVICE WITH LUMINANCE COMPENSATION FEATURES

(71) Applicant: LG Display Co., Ltd., Seoul (KR)

(72) Inventor: Sang-Kyu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/566,633

(22) Filed: Sep. 10, 2019

(65) Prior Publication Data
US 2020/0082761 A1  Mar. 12, 2020

(30) Foreign Application Priority Data
Sep. 11, 2018 (KR) .................. 10-2018-0108186

(51) Int. Cl.
*G09G 3/3258* (2016.01)
*H01L 27/32* (2006.01)

(52) U.S. Cl.
CPC ....... *G09G 3/3258* (2013.01); *H01L 27/3276* (2013.01); *G09G 2310/0289* (2013.01); *G09G 2320/0233* (2013.01); *G09G 2320/0626* (2013.01)

(58) Field of Classification Search
None
See application file for complete search history.

(56) References Cited

U.S. PATENT DOCUMENTS

| | | | | |
|---|---|---|---|---|
| 2008/0068312 A1* | 3/2008 | Kim | ................. | G09G 3/2014 345/84 |
| 2012/0306947 A1* | 12/2012 | Kim | ................. | G09G 3/2003 345/694 |
| 2013/0303776 A1* | 11/2013 | Okamoto | ............ | C07F 15/0033 548/103 |
| 2017/0193913 A1* | 7/2017 | Lee | .................... | G09G 3/3258 |

* cited by examiner

*Primary Examiner* — Amr A Awad
*Assistant Examiner* — Donna V Lui
(74) *Attorney, Agent, or Firm* — Seed IP Law Group LLP

(57) ABSTRACT

An organic light emitting display device includes: a display panel including a plurality of sub-pixels arranged in a plurality of column lines and a power line, each sub-pixel being supplied with first and second power voltages and including a light emitting diode, the power line extending along a column line direction and transferring the first power voltage; and a peak luminance control portion which derives a compensation value that is adjusted according to a maximum IR variation amount of IR variation amounts in the column line direction for a picture input thereto, applies the compensation value to an average picture level of the picture to derive a compensated average picture level, and controls a peak luminance of the picture according to the compensated average picture level, wherein the IR variation amount includes IR drop amount for the first power voltage and an IR rise amount for the second power voltage.

18 Claims, 9 Drawing Sheets

1st picture

2nd picture

ORGANIC LIGHT EMITTING DISPLAY DEVICE WITH LUMINANCE COMPENSATION FEATURES

CROSS REFERENCE TO RELATED APPLICATIONS

The present application claims the priority benefit of Korean Patent Application No. 10-2018-0108186 filed in Republic of Korea on Sep. 11, 2018, which are hereby incorporated by reference in its entirety for all purposes as if fully set forth herein.

BACKGROUND

Technical Field

The present disclosure relates to an organic light emitting display device.

Description of the Related Art

Recently, flat display devices having excellent advantages of thin profile, light weight, low power consumption and the like have been developed and applied to various technical fields.

Among the flat display devices, an organic light emitting display device displays a picture using a light emitting diode as a self-luminescent element.

To reduce a power consumption of the organic light emitting display device, a peak luminance control (PLC) driving method is suggested. The PLC driving method controls a peak luminance of a picture according to an average picture level (or average peak luminance) (APL) which is an average brightness of the picture. In the PLC driving method, a bright picture, which has a high APL and thus has a great power consumption, decreases in a peak luminance, and thus a power consumption is reduced.

However, since the related art PLC driving method controls a peak luminance according to an APL, a power is consumed unnecessarily and efficiency is reduced.

BRIEF SUMMARY

Accordingly, the present disclosure is directed to an organic light emitting display device that substantially obviates one or more of the problems due to limitations and disadvantages of the related art.

An advantage of the present disclosure is to provide an organic light emitting display device which can reduce a power consumption and achieve an effective PLC driving method.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages in accordance with the present disclosure, as embodied and broadly described herein, an organic light emitting display device includes: a display panel includes a plurality of sub-pixels arranged in a plurality of column lines and a power line, wherein each of the plurality of sub-pixels is supplied with a first power voltage and a second power voltages and includes a light emitting diode, wherein the power line extends along a column line direction and transfers the first power voltage; and a peak luminance control portion which derives a compensation value that is adjusted according to a maximum IR variation amount of IR variation amounts in the column line direction for a picture input thereto, which applies the compensation value to an average picture level of the picture to derive a compensated average picture level, and which controls a peak luminance of the picture according to the compensated average picture level, wherein the IR variation amount includes IR drop amount for the first power voltage and an IR rise amount for the second power voltage.

It is to be understood that both the foregoing general description and the following detailed description are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

Figure 1:
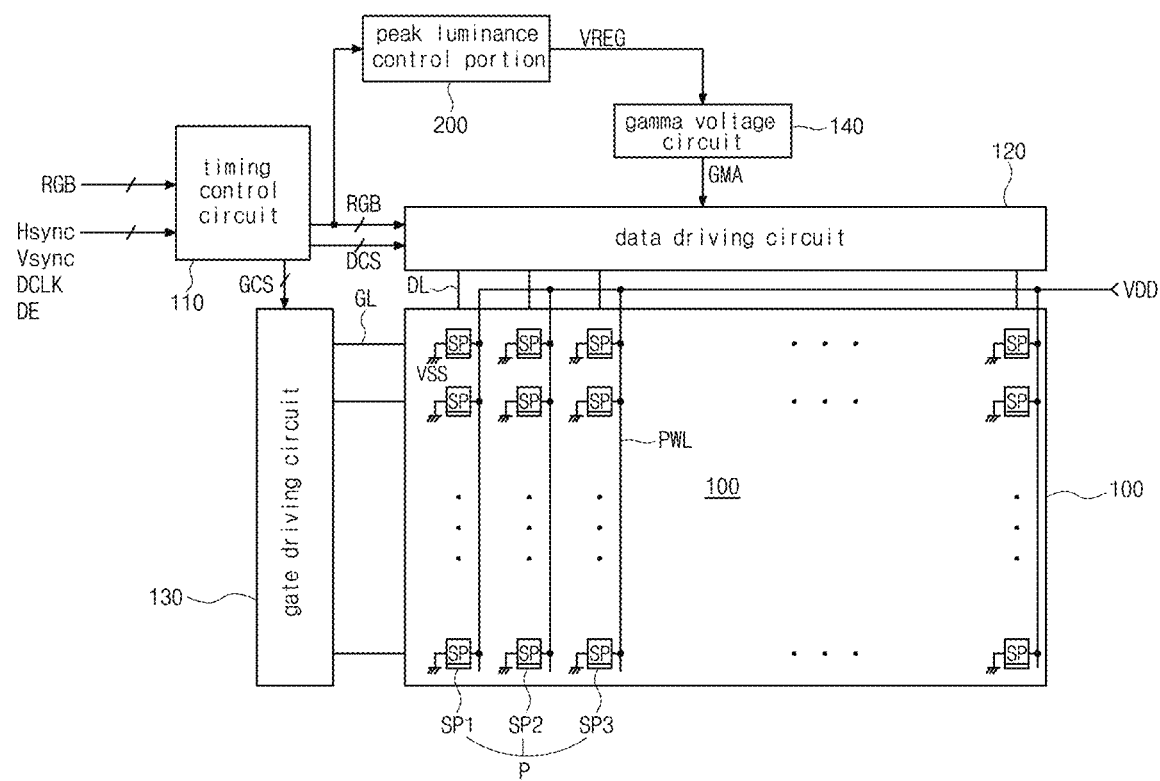
FIG. 1 is a view schematically illustrating an organic light emitting display device according to an embodiment of the present invention.
Figure 2:
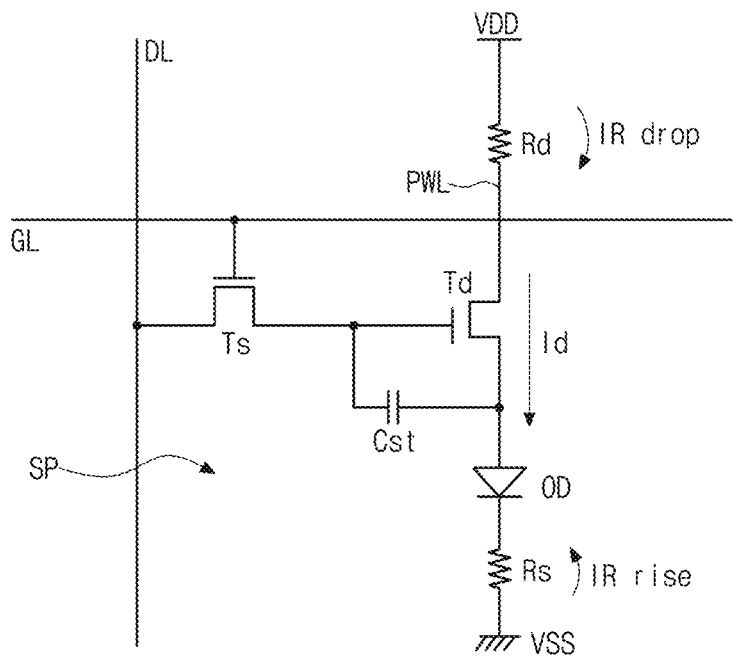
FIG. 2 is a circuit diagram of an example of a sub-pixel of an organic light emitting display device according to an embodiment of the present invention.

FIG. 1 is a view schematically illustrating an organic light emitting display device according to an embodiment of the present disclosure, and FIG. 2 is a circuit diagram of an example of a sub-pixel of an organic light emitting display device according to an embodiment of the present disclosure.

Referring to FIG. 1, the organic light emitting display device 10 of this embodiment may include a display panel 100, a panel driving circuit driving the display panel 100.

The panel driving circuit may include a timing control circuit 110, a data driving circuit 120, a gate driving circuit 130, a gamma voltage circuit 140 and a peak luminance control (PLC) circuit 200 (which may be referred to herein as a peak luminance control portion 200). The PLC portion 200 may include any electrical circuitry, features, components, an assembly of electronic components or the like configured to perform the various operations of the peak luminance control features as described herein. In some embodiments, the PLC portion 200 may be included in or otherwise implemented by processing circuitry such as a microprocessor, microcontroller, integrated circuit, chip, microchip or the like.

In the display panel 100, a plurality of sub-pixels SP may be arranged in a matrix form (or an array) along a plurality of row lines and a plurality of column lines.

Sub-pixels emitting different colors, for example, R, G and B sub-pixels SP1, SP2 and SP3 respectively emitting red, green and blue colors may be arranged alternately and repeatedly in each line along a direction, for example, in each row line along a row direction, and the neighboring R, G and B sub-pixels SP1, SP2 and SP3 may form a pixel P as a unit to display a color picture.

In the display panel 100, a plurality of gate lines GL may be arranged in respective row lines to transfer gate signals, and a plurality of data lines DL may be arranged in respective column lines to transfer data signals. The gate line GL and the data line DL may be connected to a corresponding sub-pixel SP.

In the display panel 100, a plurality of power lines PWL may be formed to transfer a first power voltage VDD as a high-potential power voltage, which may be input at a side end, for example, a top end of the display panel 100, to the sub-pixels SP in the display panel 100. This power line PWL may be referred to as a first power line PWL.

The first power line PWL may extend in a stripe form along a direction, for example, along a column direction.

Each first power line PWL may be formed per at least one column line. For the purpose of explanations, each first power line PWL being formed per a column line and connected to sub-pixels SP located in the corresponding column line is described by way of example.

In another example, each first power line PWL may be configured to be formed per two or more column lines and to be connected to sub-pixels SP located in the corresponding two or more column lines.

Even though not shown in the drawings, in the display panel 100, a second power line(s) may be formed to transfer a second power voltage VSS as a low-potential power voltage (e.g., a ground voltage) to the sub-pixels SP. The second power line may be formed to extend in a stripe form along a row direction or column direction, or to have a mesh form along row and column directions.

The sub-pixel SP of the display panel 100 may be connected to the corresponding gate line GL, data line DL, first power line PWL and second power line and be supplied with corresponding signals.

In each sub-pixel SP, a light emitting diode as a light emitting element and a sub-pixel driving circuit including a plurality of transistors to drive the light emitting diode may be formed.

An example of the sub-pixel SP may refer to FIG. 2. The sub-pixel SP may include a light emitting diode OD, a switching transistor Ts, a driving transistor Td, and a storage capacitor Cst. The sub-pixel SP may further include other type of transistor(s) as needed.

A gate electrode of the switching transistor Ts may be connected to the gate line GL, and a drain electrode of the switching transistor Ts may be connected to the data line DL.

A gate electrode of the driving transistor Td may be connected to a source electrode of the switching transistor Ts, and a drain electrode of the driving transistor Td may be connected to the first power line PWL applied with the first power voltage VDD.

A first electrode, for example, an anode of the light emitting diode OD may be connected to a source electrode of the driving transistor Td, and a second electrode, for example, a cathode of the light emitting diode OD may be connected to the second power line applied with the second power voltage VSS.

The storage capacitor Cst may be connected between the gate electrode and the source electrode of the driving transistor Td.

A picture display operation of the sub-pixel SP may be as follows. The switching transistor Ts may be turned on according to a gate signal as a scan signal of a turn-on level (e.g., a high level) supplied through the gate line GL. In synchronization with this, a data signal applied to the data line DL may be supplied to the gate electrode of the driving transistor Td through the switching transistor Ts.

Accordingly, the driving transistor Td may be turned on by the data signal, and may control a driving current (or light emission current) Id supplied to the light emitting diode OD.

The light emitting diode OD may be supplied with the driving current Id generated by the driving transistor Td and may emit a light of a luminance based on the driving current Id.

For the first power voltage VDD actually applied to the sub-pixel SP to drive the sub-pixel SP, an IR drop may be produced by a resistance component Rd on a high-potential side such as the first power line PWL located on a transfer path of the first power voltage VDD. Thus, the first power voltage VDD may decrease by an IR drop amount and be then applied to the sub-pixel SP.

Similarly, for the second power voltage VSS actually applied to the sub-pixel SP, an IR rise may be produced by a resistance component Rs on a low-potential side such as the second power line located on a transfer path of the second power voltage VSS. Thus, the second power voltage VSS may increase by an IR rise amount and then be applied to the sub-pixel SP.

Accordingly, in some embodiments, a difference (VDD-VSS) between the first power voltage VDD and the second power voltage VSS as a driving voltage (ELV) to drive the sub-pixel SP of the display panel 100 is set with a margin for the driving voltage (ELV) reflecting (or including) at least an IR drop amount for the first power voltage VDD and an IR rise amount for the second power voltage VSS.

In this regard, it may be preferable that the driving voltage (ELV) is set to be equal to or greater than a sum of a light emitting diode voltage (Vod) applied to the light emitting diode OD, a driving transistor voltage (Vtft) applied to the driving transistor Td, an IR drop amount (VDD_d) and an IR rise amount (VSS_r). In other words, ELV≥(VDD_d+Vtft+Vod+VSS_r).

When the driving voltage ELV is set as above, an I-V property may be secured, and the driving current Id may exists in a saturation section and thus a luminance property may be secured.

Referring to FIG. 1, the timing control circuit 110 may be supplied with a plurality of timing signals, for example, a vertical synchronization signal Vsync, a horizontal synchronization signal Hsync, a dot clock signal DCLK and a data enable signal DE, from an external system such as television (TV) system or graphic card. Using the timing signals, the timing control circuit 110 may generate a data control signal DCS to control an operation timing of the data driving circuit 120, and a gate control signal GCS to control an operation timing of the gate driving circuit 130. Further, the timing control circuit 110 may rearrange picture data RGB from the external system suitably to the display panel 100, and supply the picture data RGB to the data driving circuit 120.

The data driving circuit 120 may be supplied with a plurality of gamma voltages GMA from the gamma voltage circuit 140, and may be supplied with the picture data RGB from the timing control circuit 110. According to the data control signal DCS, the data driving circuit 120 may convert digital picture data RGB into analog data signal using the gamma voltages GMA and supply the data signals to the data line DL. The data driving circuit 120 may be configured to include at least one data IC.

The gate driving circuit 130 may generate gate signals according to the gate control signal GCS, and may sequentially output the gate signals to the gate lines GL by a row line. The gate driving circuit 130 may be configured in a gate-in-panel (GIP) type to be formed directly on a non-display region of the display panel 100.

The gamma voltage circuit 140 may generate the plurality of gamma voltages GMA respectively corresponding to a plurality of gray levels which the picture data RGB can realize, and may supply the plurality of gamma voltages GMA to the data driving circuit 120. For example, in a case that the picture data RGB is a 8-bit data, $0^{th}$ to $255^{th}$ gamma voltages GMA respectively corresponding to $0^{th}$ to $255^{th}$ gray levels may be generated. The gamma voltage circuit 140 may be configured to be included in the data driving circuit 120).

The gamma voltage circuit 140 may include, for example, a string of resistors. In this case, a high-potential gamma source voltage VREG and a low-potential gamma source voltage (e.g., a ground voltage) may be applied to both ends of the resistor string, and thus the plurality of gamma voltages GMA may be output at respective nodes between neighboring resistors of the resistor strings.

Levels of the gamma voltages GMA may be proportional to a level of the high-potential gamma source voltage VREG, and the gamma voltages GMA may be adjusted as the high-potential gamma source voltage VREG may be adjusted. Accordingly, by adjusting the high-potential gamma source voltage VREG, a level of a highest gamma voltage, which corresponds to a white gray level as a highest gray level (e.g., $255^{th}$ gray level) that the picture data RGB can realize, may be adjusted.

The panel driving circuit of the organic light emitting display device 10 may include the PLC portion 200, which may be configured to control a peak luminance according to an IR variation amount, which is an IR drop amount and an IR rise amount for power voltages in the display panel 100 in displaying a picture, and thus to reduce a power consumption and achieve more effective PLC driving.

In this regard, in the related art PLC driving, an average picture level (APL), which is an average brightness of picture data (RGB) for a picture of, for example, one frame, is calculated. The average picture level (APL) may be calculated, for example, by a following formula (1).

$$APL(\%) = \frac{\sum \text{Max}(R, G, B)/255}{N} * 100. \quad \text{Formula (1)}$$

As indicated by the formula (1), a sum of each maximum gray level in each of all pixels P divided by a highest gray level for picture data (RGB), for example, 255, is divided by a number N of all pixels P and multiplied by 100 to calculate an APL in percentage. In other words, a maximum gray level out of gray levels of R, G and B sub-pixels SP1, SP2 and SP3 in each pixel P is divided by the highest gray level for picture data (RGB), for example, 255, and all maximum gray levels divided by the highest gray level is averaged by the number N of all pixels P to calculate the APL in percentage.

According to the APL obtained as above, a peak luminance applied for the picture data RGB, e.g., a peak luminance for a white gray level as a highest gray level may be set.

Figure 3:
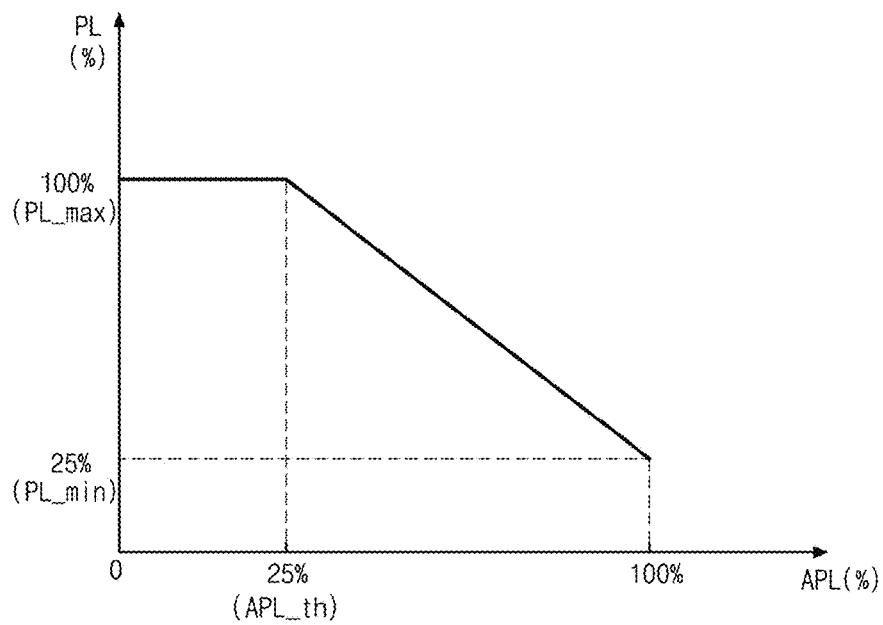
FIG. 3 is a view illustrating a relation of an average picture level and a peak luminance according to an embodiment of the present invention.

This may refer to, for example, a peak luminance control graph (or curve) of FIG. 3. When an APL is equal to or less than a threshold value APL_th, for example, 25%, a peak luminance PL may be set as a maximum peak luminance PL_max, 100% (e.g., 400 nit; 400 cd/m$^2$) permissible to be output by the display panel 100. The threshold value APL_th may be adjusted by a performance or the like of the display device. For example, the threshold value APL_th may be set as 50% or less.

When an APL is greater than the threshold value APL_th, a peak luminance PL may be set to be reduced in inverse proportion to an APL. For example, as shown in FIG. 3, a peak luminance PL and an APL may be set by a function of a first order linear relation which has a slope of −1, and in this case, a peak luminance PL may become a minimum peak luminance PL_min, for example, 25% (e.g., 100 nit) when an APL is 100%. Alternatively, a peak luminance PL may be set to be reduced according to a function of a non-linear relation.

As described above, in the related art, a peak luminance PL is set according to an APL.

In this embodiment, a peak luminance PL may be set to reflect not only an APL but also IR drop amount and IR rise amount. Accordingly, a power consumption may be further reduced.

Figure 4:
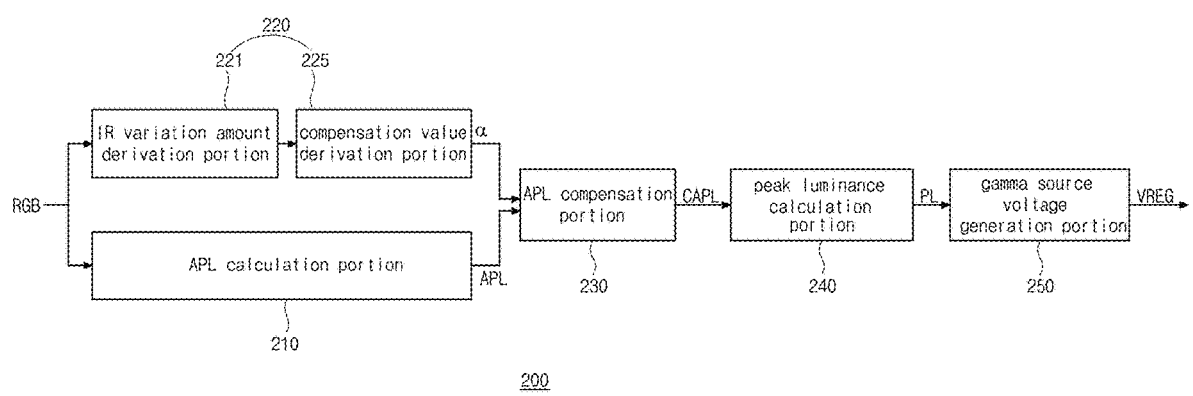
FIG. 4 is a view schematically illustrating configuration of a peak luminance control portion according to an embodiment of the present invention.

This is explained further with reference to FIG. 4 which is a view schematically illustrating configuration of the peak luminance control portion 200 of this embodiment.

The peak luminance control portion 200 may include an APL calculation circuit 210 (which may be referred to herein as a APL calculation portion 210), a compensation value calculation circuit 220 (which may be referred to herein as a compensation value calculation portion 220), an APL compensation circuit 230 (which may be referred to herein as an APL compensation portion 230), a peak luminance calculation circuit 240 (which may be referred to herein as a peak luminance calculation portion 240), and a gamma source voltage generation circuit 250 (which may be referred to herein as a gamma source voltage generation portion 250). The APL calculation circuit 210, a compensation value calculation circuit 220, an APL compensation circuit 230, a peak luminance calculation circuit 240, and a gamma source voltage generation circuit 250 may include any electrical circuitry, features, components, an assembly of electronic components or the like configured to perform the various operations of the APL calculation circuit 210, a compensation value calculation circuit 220, an APL compensation circuit 230, a peak luminance calculation circuit 240, and a gamma source voltage generation circuit 250 as described herein. In some embodiments, one or more of APL calculation circuit 210, compensation value calculation circuit 220, APL compensation circuit 230, peak luminance calculation circuit 240, and gamma source voltage generation circuit 250 may be included in or otherwise implemented by processing circuitry such as a microprocessor, microcontroller, integrated circuit, chip, microchip or the like. The peak luminance control portion 200 may be configured in various manners. For example, at least portion of the components in the peak luminance control portion 200 may be located in the timing control circuit 110 or the data driving circuit 120.

The APL calculation portion 210 may calculate an APL as an average brightness of a picture using the above formula (1).

In other words, according to the formula, $$APL(\%) = \frac{\sum \text{Max}(R, G, B)/255}{N} * 100,$$

an APL may be obtained.

The compensation value calculation portion 220 may calculate a compensation value (or gain) for an APL.

The compensation value calculation portion 220 may include an IR variation amount derivation portion 221 and a compensation value derivation portion 225.

The IR variation amount derivation portion 221 may derive an IR variation amount (e.g., an IR drop amount and an IR rise amount) in a column direction, which is an extension direction of the first power line PWL to transfer the first power voltage VDD, as a direction along which the IR variation amount is produced in displaying a picture.

Figure 5:
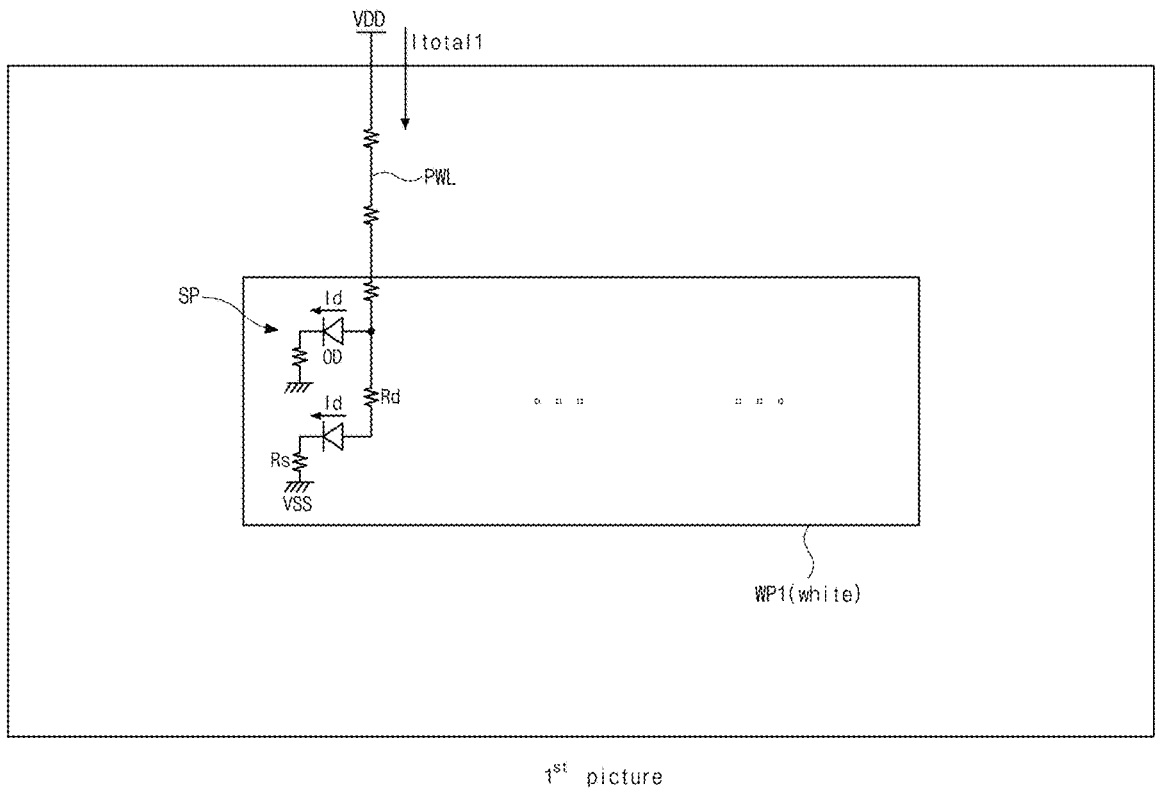
FIGS. 5 and 6 are views illustrating a first picture and a second picture, respectively, displayed in an organic light emitting display device according to an embodiment of the present invention.
Figure 6:
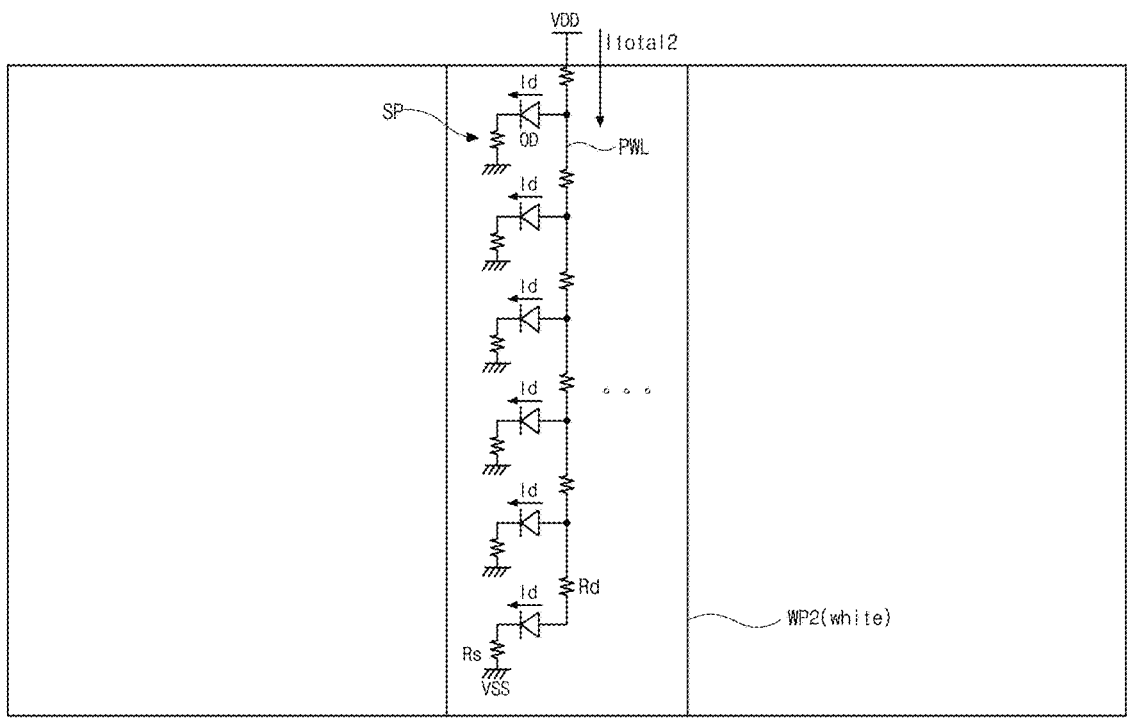

This refers to FIGS. 5 and 6.

FIG. 5 is a view illustrating a first picture displayed in the organic light emitting display device according to the embodiment of the present disclosure, and FIG. 6 is a view illustrating a second picture displayed in the organic light emitting display device according to the embodiment of the present disclosure.

The first picture of FIG. 5 has a type that a white pattern WP1, e.g., a first white pattern WP1 extends along a horizontal direction, e.g., a row direction and other region displays black. The second picture of FIG. 6 has a type that a white pattern WP2, e.g., a second white pattern WP2 extends along a vertical direction, e.g., a column direction and other region displays black. The first picture and the second picture have the same APL.

The first white pattern WP1 of the first picture has a relative less number of sub-pixels SP which are located in each column line to display the first white pattern WP1 while the second white pattern WP2 of the second picture has a relative greater number of sub-pixels SP which are located in each column line to display the second white pattern WP2.

Accordingly, a total driving current Itotal1 which is a sum of driving currents Id to display the first white pattern WP1 is less than a total driving current Itotal2 which is a sum of driving currents Id to display the second white pattern WP2. Further, resistance components Rd and Rs of lines which the driving currents Id pass through to display the first white pattern WP1 are less than resistance components Rd and Rs of lines which the driving currents Id pass through to display the second white pattern WP2.

Accordingly, the second picture having the second white pattern WP2 has an IR drop amount for the first power voltage VDD and an IR rise amount for the second power voltage VSS greater than those of the first picture having the first white pattern WP1, and thus the second picture having the second white pattern WP2 has a power consumption greater than that of the first picture having the first white pattern WP1.

As such, pictures having the same APL may differ in power consumption because of the difference in IR variation amount among pictures. Accordingly, the problem of some pictures having a great power consumption due to the increase of IR variation amount which increases the margin for a driving voltage can be addressed by reducing a peak luminance by a selected level for the pictures showing great power consumption. By reducing the peak luminance by a selected level, unnecessary power consumption in the pictures may be reduced.

Thus, in this embodiment, an IR variation amount in a column line direction, along which a driving voltage Id is transferred, may be derived for a picture to be displayed, and based on this, an APL may be compensated and a peak luminance PL may be adjusted.

To do this, the IR variation amount derivation portion 221 may derive an IR variation amount for a column line direction of the display panel 100.

For example, with a column line formed as a derivation unit, the IR variation amount derivation portion 221 may derive an IR variation amount for each column line. This is applied to a structure that each first power line PWL is formed in each column line.

Alternatively, in some embodiments, with two or more neighboring (or consecutive) column lines forming a derivation unit, the IR variation amount derivation portion 221 may derive an IR variation amount for each derivation unit. In other words, two or more neighboring (or consecutive) column lines may be formed as a column line block, and an IR variation amount may be calculated for each column line block. In this case, by dividing the calculated IR variation amount by a number of column lines included in the column line block, an IR variation amount for each column line in the column line block may be derived. Regarding the column line block, in a case that at least two neighboring column lines are connected to one first power line PWL, such the neighboring column lines connected to the one first power line PWL may be formed as a column line block.

Alternatively, in a case that the data driving circuit 120 is configured with a plurality of driving ICs, column lines driven by each driving IC may be formed as a column line block, and an IR variation amount for such the column line block may be derived.

Figure 7:
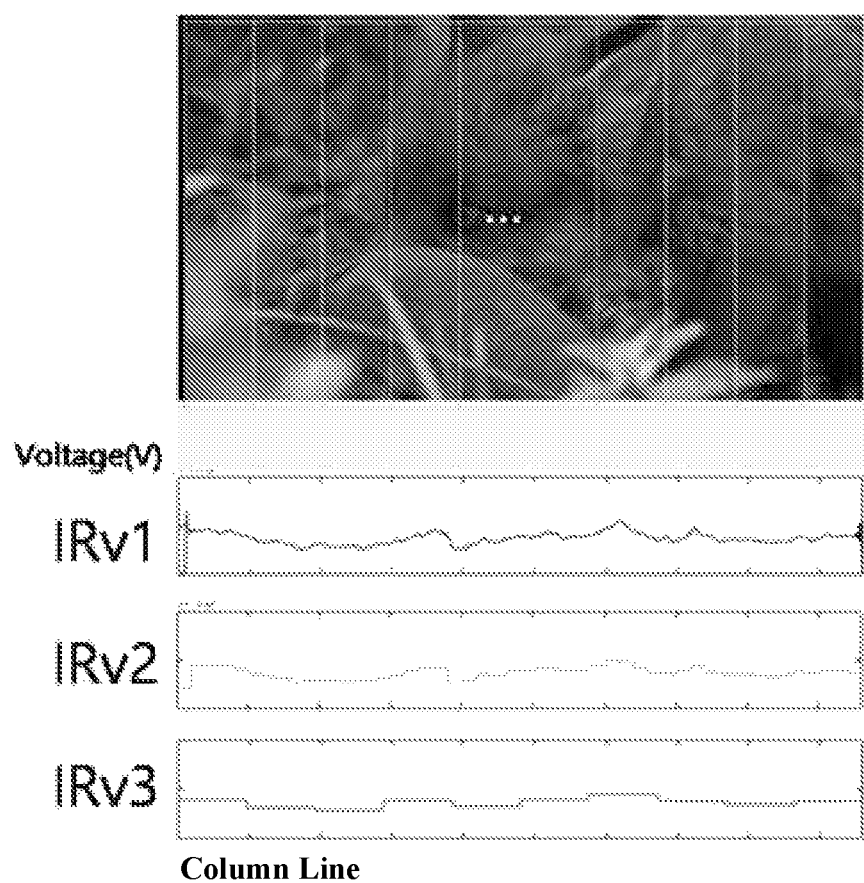
FIG. 7 is a view illustrating examples deriving an IR variation amount according to an embodiment of the present invention.

The above cases may refer to FIG. 7, which is a view illustrating examples deriving an IR variation amount according to the embodiment of the present disclosure.

In FIG. 7, a first graph IRv1 is a graph showing IR variations at positions of a column line in a case that an IR variation amount for each column is derived individually. A second graph Irv2 is a graph showing IR variations at positions of a column line in a case that column lines connected to each first power line are formed as a column line block. A third graph Irv3 is a graph showing IR variations at positions of a column line in a case that column lines corresponding to each driving IC are formed as a column line block.

The compensation value derivation portion 225 may receive IR variation amounts in a column line direction derived by the IR variation amount derivation portion 221, and may detect a maximum IR variation amount out of the received IR variation amounts. The compensation value derivation portion 225 may derive a compensation value α based on the maximum IR variation amount.

In this regard, referring to FIGS. 5 and 6, in a case of a picture of FIG. 5, a column line(s) at which the first white pattern WP1 is located may have a maximum IR variation amount, and based on such the column line(s), a corresponding compensation value α may be derived. In a case of a picture of FIG. 6, a column line(s) at which the second white pattern WP2 is located may have a maximum IR variation amount, and based on such the column line(s), a corresponding compensation value α may be derived.

A compensation value α may be configured such that a compensated average picture level (CAPL) has an increasing trend according to an IR variation amount. To do this, for example, a compensation value α may be set to have a decreasing trend according to an IR variation amount.

Figure 8:
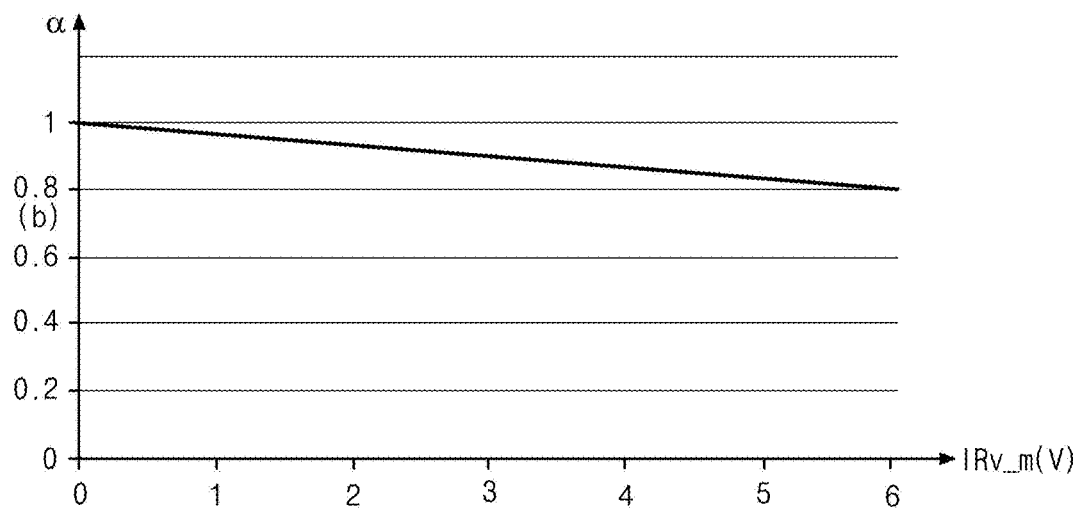
FIGS. 8 to 10 are views illustrating examples of a relation of a maximum IR variation amount and a compensation value according to an embodiment of the present invention.

For example, referring to FIG. 8, a compensation value α may be set to decrease in a first order linear form according to a magnitude of a maximum IR variation amount IRv_m.

In this case, a range of the compensation value α may be set by a following formula (2).

$$b \leq \alpha \leq 1. \quad \text{Formula (2)}$$

As indicated by the formula (2), the compensation value α may be set such that an upper limit for a lowest value of the maximum IR variation amount IRv_m is 1 and a lower limit for a highest value of the maximum IR variation amount IRv_m is b which is less than 1.

The lower limit, b may be adjusted and set by a manufacturer in a range to secure a minimum display quality according to a characteristic, a use and the like of the display panel 100. For example, the lower limit, b may be equal to or greater than about 0.5 and less than about 1, and preferably, may be equal to or greater than about 0.8 and less than about 1. In this embodiment, the lower limit, b is about 0.8 by way of example.

The compensation value α may substantially correspond to a gain for a peak luminance PL of a corresponding picture. A case of the compensation value α being 1 may mean that a peak luminance PL is not adjusted but is maintained. A case of the compensation value α being less than 1 may mean that a peak luminance PL is reduced. In other words, as a maximum IR variation amount IRv_m may increase, a peak luminance PL may decrease.

By reducing a peak luminance PL when a maximum IR variation amount IRv_m is great, an IR variation amount, e.g., a margin for a driving voltage for a corresponding picture may be reduced and thus unnecessary power consumption may be reduced. Accordingly, a power consumption for a picture which consumes a great power may be reduced.

A relation between a compensation value α and a maximum IR variation amount IRv_m may be made different from the relation shown in FIG. 8. For example, the relation may be made as shown in FIG. 9 or 10.

Figure 9:
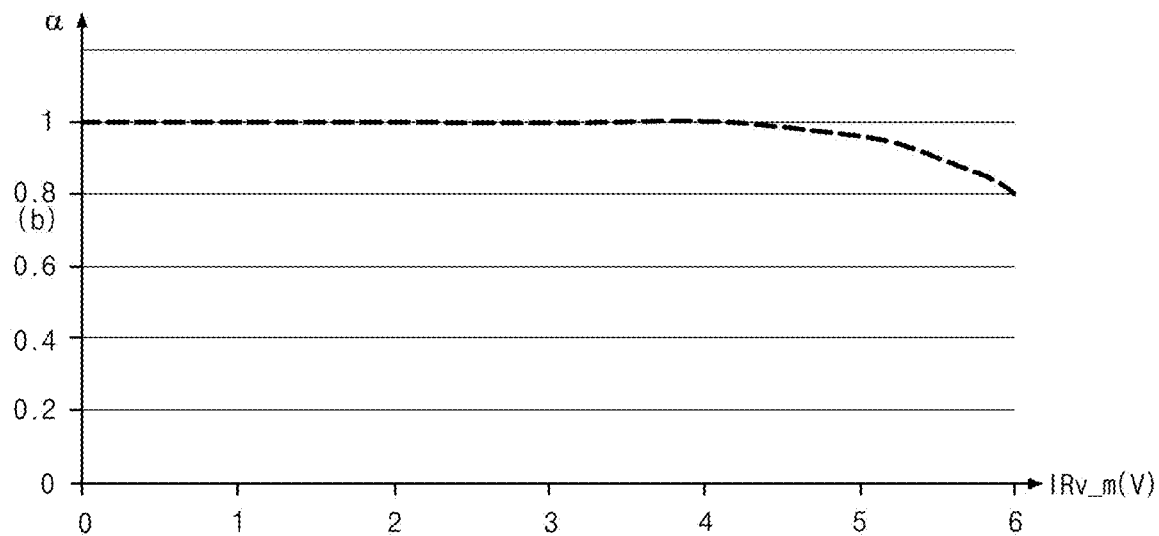

FIG. 9 shows a case that a compensation value α has a decreasing trend according to a maximum IR variation amount IRv_m, wherein the compensation value α is maintained at 1 up to a predetermined magnitude of a maximum IR variation amount IRv_m and then decreases along a parabola of a upwardly convex shape. This setting of the compensation value α may be applied effectively to a case of displaying a more dynamic picture or a case of a display panel having a relatively high performance (or efficiency).

Figure 10:
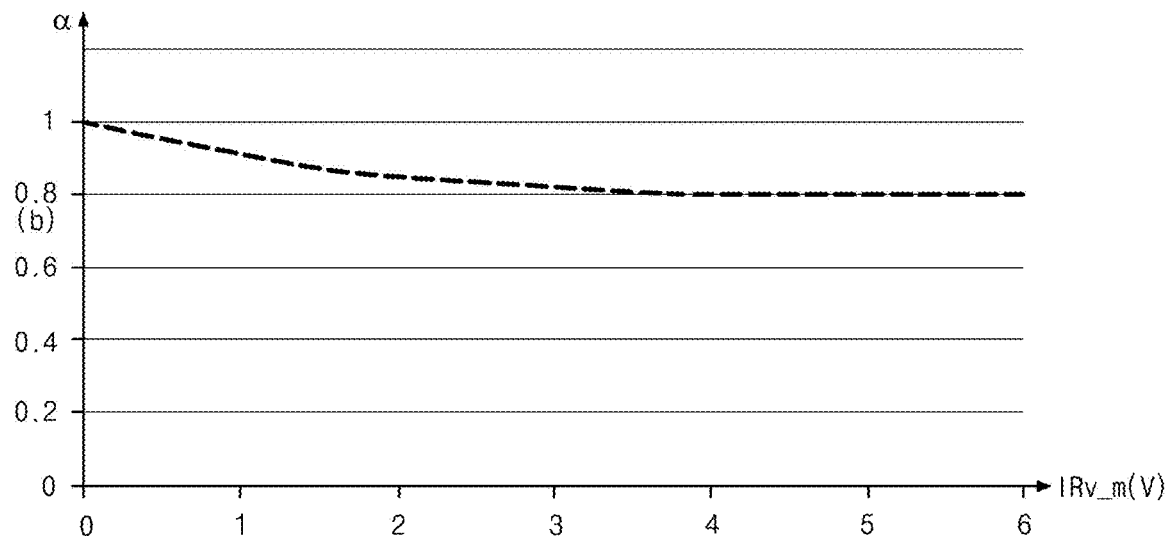

FIG. 10 shows a case that a compensation value α has a decreasing trend according to a maximum IR variation amount IRv_m, wherein the compensation value α decreases along a parabola of a downwardly convex shape up to a predetermined magnitude of a maximum IR variation amount IRv_m and then is saturated to a lower limit, b. This setting of the compensation value α may be applied effectively to a case of displaying a more static picture or a case of a display panel having a relatively low performance (or efficiency).

A compensation value α derived as above may be input along with an APL to the APL compensation portion 230.

The APL compensation portion 230 may conduct a compensation by applying the compensation value α to the APL thus calculate a compensated APL (CAPL).

In this regard, for example, a CAPL may be set by a following formula (3).

$$\text{CAPL} = \{(APL = APL\_th)/\alpha \text{ (when } 0 \leq APL \leq APL\_th);$$
$$APL/\alpha \text{ (when } APL\_th < APL)\} \text{(when}$$
$$\text{CAPL} > 100\%, \text{CAPL} = 100\%). \quad \text{Formula (3)}$$

As indicated by the formula (3), when an APL is equal to or less than an APL_th, the APL becomes the APL_th and is divided by α to calculate a CAPL.

When an APL is over an APL_th, the APL is divided by α to calculate a CAPL.

In the formula (3), when a CAPL is over 100%, the CAPL becomes 100%.

The APL compensation portion 230 may compensate an APL using a compensation value α to calculate a CAPL.

A CAPL may be input to the peak luminance calculation portion 240, and the peak luminance calculation portion 240 may calculate a peak luminance PL according to an CAPL. For example, based on the peak luminance control graph of FIG. 3, a peak luminance PL according to a CAPL may be calculated.

Figure 11:
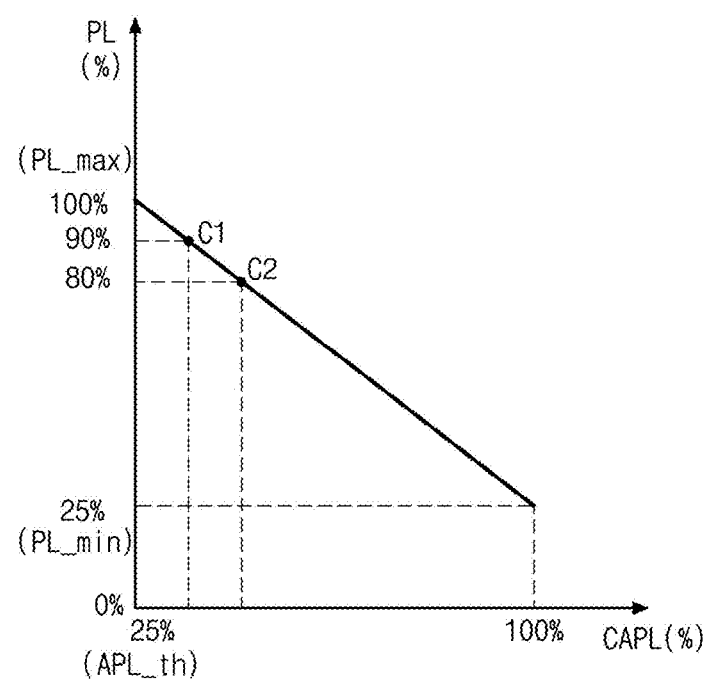
FIG. 11 is a view illustrating an example of a relation of a CAPL and a peak luminance according to an embodiment of the present invention.

This may refer to FIG. 11, which is a view illustrating an example of a relation of a CAPL and a peak luminance PL.

The peak luminance control graph of FIG. 11 may be based on the peak luminance control graph of FIG. 3. In FIG. 11, an example is shown that as a CAPL increases, a peak luminance PL decreases in a first order linear relation with a slope of −1.

Referring to FIG. 11, as in the formula (3), a CAPL may have a minimum value which is a threshold value APL_th, 25% of an APL, and at this minimum value of a CAPL, a maximum peak luminance PL_max may be set. Between the minimum value, 25% and a maximum value, 100% of a CAPL, a graph of FIG. 11 may be equal to a graph of FIG. 3.

Accordingly, for pictures having the same APL, a peak luminance PL may decrease as an IR variation amount may increase. Thus, power consumption may be effectively reduced.

This may further refer to FIGS. 5 and 6. The second picture having the second white pattern WP2 has a maximum IR variation amount IRv_m greater than that of the first picture having the first white pattern WP1.

In this regard, a compensation value α of the second picture having a greater maximum IR variation amount IRv_m may be set to be, for example, 0.8, and a compensation value α of the first picture having a less maximum IR variation amount IRv_m may be set to be, for example, 0.9 greater than 0.8 of the compensation value α of the second picture.

In this case, when the first and second pictures have the same APL of 25%, a CAPL of the first picture may be adjusted to a point C1 of FIG. 11, 25%/0.9, and a CAPL of the second picture may be adjusted to a point C2 of FIG. 11, 25%/0.8.

Accordingly, a peak luminance of the first picture may be set to be 90%, and a peak luminance of the second picture may be set to be 80%.

As such, a peak luminance PL may decrease as an IR variation amount may increase, and thus a driving current to display a picture may decrease. This may result in a reduction of an IR variation amount, e.g., a reduction of a margin for a driving voltage, and thus a power consumption may be reduced.

As described above, in this embodiment, for an input picture, an APL of the picture may be compensated according to an IR variation amount of the picture, and a peak luminance PL of the picture may be controlled based on a CAPL.

Accordingly, for a picture in which an IR variation amount is great and thus a power consumption is great, a CAPL may become high thus a peak luminance may be reduced and thus a power consumption may be reduced.

The gamma source voltage generation portion 250 may receive a peak luminance PL output from the peak luminance calculation portion 240, and may generate and output a high-potential gamma source voltage VREG corresponding to the peak luminance PL using the peak luminance PL.

Accordingly, a gamma voltage, of a highest gray level, corresponding to the peak luminance PL may be generated.

Figure 12:
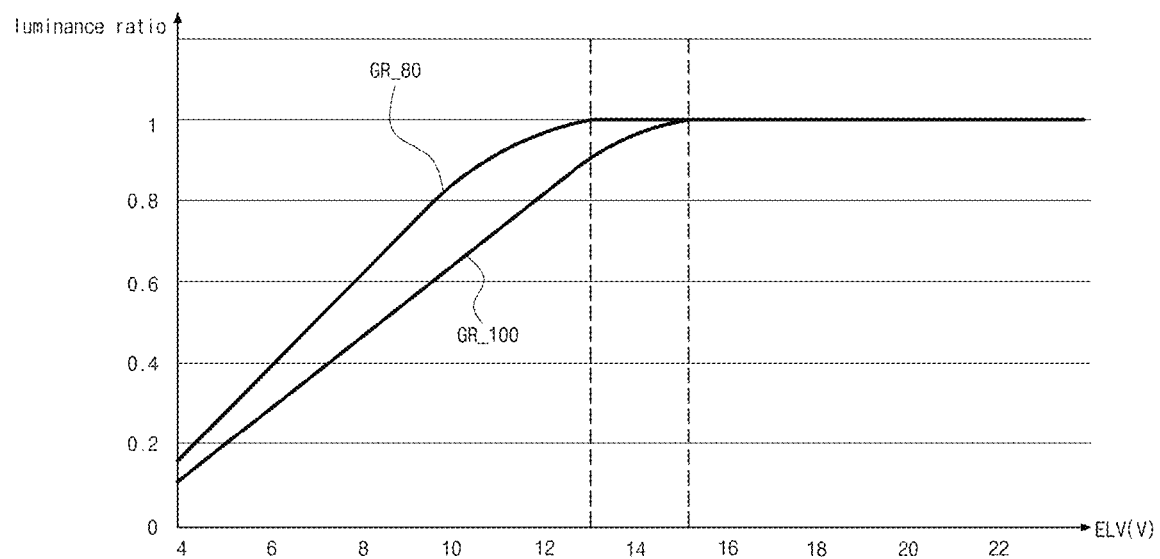
FIG. 12 is a view illustrating graphs of a driving voltage to a luminance ratio when peak luminances are 100% and 80% in an organic light emitting display device according to an embodiment of the present invention.

FIG. 12 is a view illustrating graphs of a driving voltage to a luminance ratio when peak luminances are 100% and 80% in an organic light emitting display device according to the embodiment of the present disclosure.

In FIG. 12, a luminance ratio shown in a y-axis indicates a ratio of a luminance, which is expressed at a driving voltage ELV, to a peak luminance in each graph.

First and second graphs GR_100 and GR_80 of FIG. 12 respectively indicate relations of a driving voltage to a luminance ratio when peak luminances are set as 100% and 80% for a picture, similar to a picture of FIG. 6, in which a white pattern extending entirely along a column line is displayed thus a maximum IR variation amount has the greatest value permissible in the display panel and which has a peak luminance of 25%.

The first graph GR_100 is a graph relating to a PLC driving based on an APL as in the related art, and a driving voltage ELV required for this is about 15(V). When a second power voltage is a ground voltage, a first power voltage of about 15(V) is required.

The second graph GR_80 is a graph relating to a PLC driving based on a CAPL as in this embodiment, and in this case, a driving voltage ELV required for saturation of a driving current is less than 15(V), for example, about 12.8(V). When a second power voltage is a ground voltage, a first power voltage of about 12.8(V) is required.

As such, in the PLC driving based on a CAPL according to this embodiment, a required driving voltage ELV may be reduced by about 2.2(V) (e.g., about 15%), compared with a required driving voltage in the PLC driving based on an APL according to the related art. Since the driving voltage ELV to drive the organic light emitting display device is reduced, a power consumption can be reduced accordingly.

Figure 13:
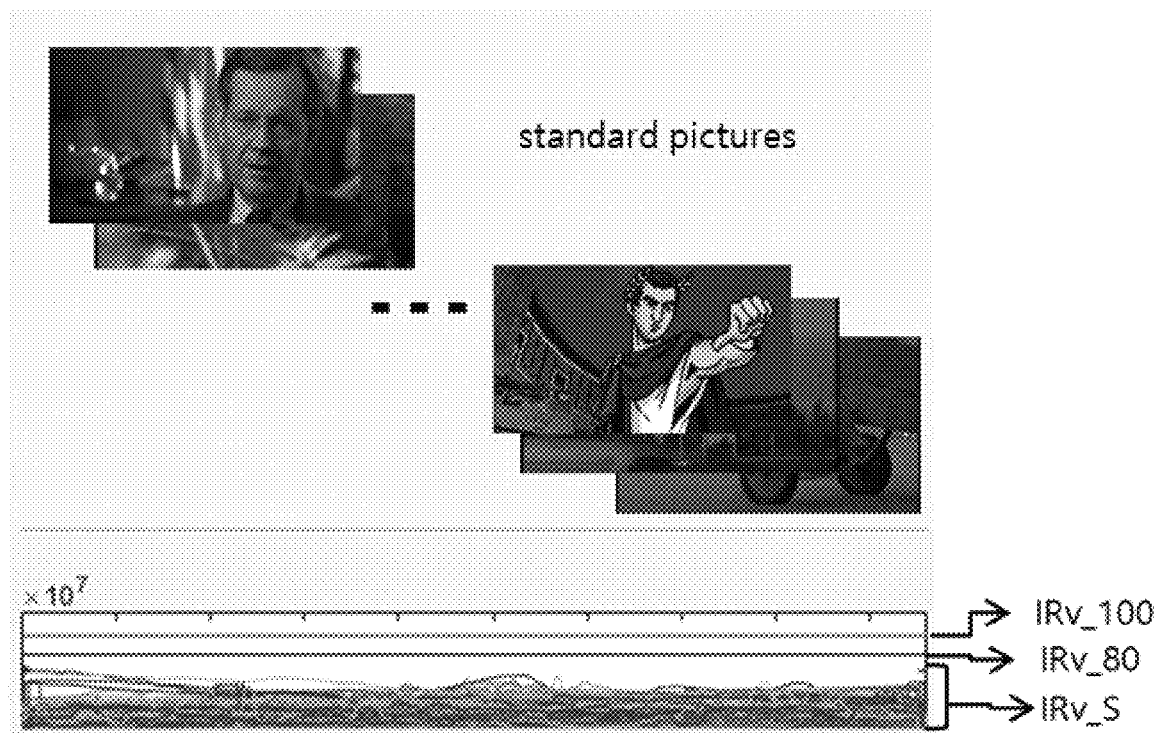
FIG. 13 is a view illustrating IR variation amounts for standard pictures displayed generally in an organic light emitting display device.

FIG. 13 is a view illustrating IR variation amounts (or margins for a driving voltage) for standard pictures displayed generally in an organic light emitting display device. In FIG. 13, magnitudes of IR variation amounts are compared with respect to an IR variation amount of a full white picture having a peak luminance of 100%.

Referring to FIG. 13, IR variation amounts IRv_S of standard pictures which are mostly displayed in an organic light emitting display device have peak luminances of quite low levels compared with an IR variation amount IRv_100 of a picture having a peak luminance of 100%, and also have peak luminances of low levels compared with an IR variation amount IRv_80 of a picture of a peak luminance which is adjusted to be reduced from 100% to a lower level, for example, 80% according to a PLC of this embodiment. In other embodiments, the selected level for reducing the peak luminance may vary and is not limited to the above example level.

Thus, even when a driving voltage is reduced, a luminance property in displaying a picture can be substantially maintained and a display quality can be secured. Thus, a power consumption can be reduced, and an efficient PLC driving can be realized.

In one embodiment, the PLC driving according to the present disclosure may be applied to an organic light emitting display device including a light emitting diode that is configured with a single stacked structure using a soluble process and that is a top emission type diode in which a second electrode as an upper electrode of the light emitting diode has a transparent property. In other embodiments, the PLC driving according to the present disclosure may be applied to other light emitting device having various different configurations. For example, the PLC driving method can be applied to light emitting diodes having multi-stack structure. Further, it may be used in other emission types including bottom emission type diodes.

However, for explanation purposes, the PLC driving method will be explained in connection with an organic light emitting display device including a light emitting diode that is configured with a single stacked structure using a soluble process and that is a top emission type diode in which a second electrode as an upper electrode of the light emitting diode has a transparent property. This organic light emitting display device is explained with reference to FIG. 14. For the purpose of explanations, a light emitting diode is mainly shown in FIG. 14.

Figure 14:
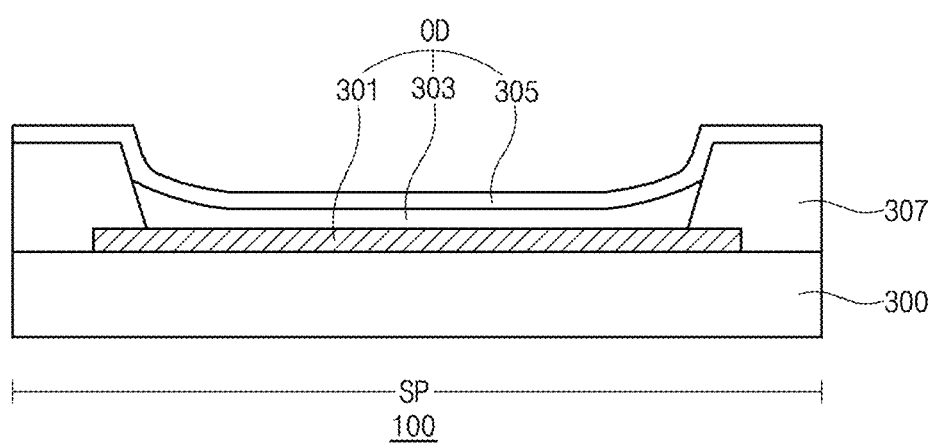
FIG. 14 is a view illustrating an example of an organic light emitting display device according to an embodiment of the present disclosure.

Referring to FIG. 14, light emitting diodes OD emitting, for example, red, green and blue lights may be formed in respective sub-pixels SP on a substrate 300 of a display panel 100.

Even though not shown in the drawings, a driving transistor (Td of FIG. 2) electrically connected to the light emitting diode OD may be formed between the light emitting diode OD and the substrate 300.

The light emitting diode OD may include a first electrode 301, an organic light emitting layer 303 located on the first electrode and emitting a corresponding color light of its sub-pixel SP, and a second electrode 305 on the organic light emitting layer 303.

The first electrode 301 may be connected to a source electrode of the driving transistor. A bank 307 may be formed on edges of the first electrode 301 along a boundary of the sub-pixel SP.

The organic light emitting layer 303 may be formed in an opening between the bank 307 and an adjacent bank 307 through a soluble process.

The first electrode 301 may serve as, for example, an anode, and the second electrode 305 may serve as, for example, a cathode.

To realize a top emission type, the first electrode 301 as a lower electrode may have a reflective property, and the second electrode 305 as an upper electrode may have a transparent property.

In the above configured organic light emitting display device, since the organic light emitting layer 303 is formed in a single stacked structure to display a color light of its sub-pixel SP, a light emitting diode voltage is low, and since the second electrode 305 is formed as a transparent electrode that has high resistance, the IR rise amount increases accordingly.

Thus, due to an IR variation, an unnecessary power consumption increases. Accordingly, by applying the PLC driving of this embodiment, a power consumption can be effectively reduced.

The PLC driving of this embodiment may be applied to all types of organic light emitting display devices including the above configured organic light emitting display device.

In the above embodiment, a PLC driving is conducted in which for a picture to be displayed, an APL is compensated based on an IR variation amount, and a peak luminance is controlled based on a compensated APL.

Accordingly, a luminance property in a PLC driving can be maintained, and thus a display quality of the same level can be secured. A peak luminance can be adjusted adaptively according to an IR variation amount, thus a required driving voltage can be reduced, and thus an unnecessary power consumption can be reduced. Therefore, by reducing a power consumption, an efficient PLC driving can be realized.

Further embodiments of the present disclosure are provided below.

One embodiment of the present disclosure provides a device including: a plurality of sub-pixels in a display panel, wherein each of the plurality of sub-pixels is supplied with a first power voltage and a second power voltage; and a peak luminance control circuit.

Each of the plurality of sub-pixels include: a light emitting element having a first terminal and a second terminal; a first resistor, the first resistor connected to the first terminal of the light emitting element; a second resistor, the second resistor connected to the second terminal of the light emitting element; a first power source connected to the light emitting element via the first resistor, the first power source supplying the first power voltage to the light emitting element; a second power source connected to the light emitting element via the second resistor, the second power source supplying the second power voltage to the light emitting element; and a power line connecting the first power source to the light emitting element, the power line arranged along a column direction of the display panel, wherein the power line includes the first resistor and transfers the first power voltage to the light emitting element via the first resistor.

In one embodiment, the peak luminance control circuit is configured to: derive a compensation value that is adjusted according to a maximum IR variation amount of IR variation amounts in the column direction for a picture input thereto, wherein the IR variation amount includes an IR drop amount of the first power voltage across the first resistor and an IR rise amount of the second power voltage across the second resistor; apply the compensation value to an average picture level of the picture to derive a compensated average picture level; and control a peak luminance of the picture according to the compensated average picture level.

In one embodiment, the second power source is a low-potential power voltage.

In one embodiment, the peak luminance control circuit includes: an average picture level calculation portion which calculates the average picture level of the picture; an IR variation amount derivation portion which derives IR variation amounts of the plurality of column direction for the picture; a compensation value derivation portion which derives the compensation value that is adjusted according to the maximum IR variation amount of the IR variation amounts of the plurality of column direction; an average picture level compensation portion which applies the compensation value to the average picture level to derive the compensated average picture level; and a peak luminance calculation portion which calculates the peak luminance of the picture according to the compensated average picture level.

In one embodiment, the peak luminance control circuit includes a gamma source voltage generation portion which generates a high-potential gamma source voltage corresponding to the peak luminance.

The device further includes: a gamma voltage circuit which generates a plurality of gamma voltages corresponding to the high-potential gamma source voltage using the high-potential gamma source voltage.

In one embodiment, the compensation value is set such that the compensated average picture level has an increasing trend as the maximum IR variation amount increases.

In one embodiment, the compensation value is set such that the compensation value have a decreasing trend as the maximum IR variation amount increases.

In one embodiment, an upper limit of the compensation value is 1, and a lower limit of the compensation value is equal to or greater than 0.5 and less than 1.

In one embodiment, the compensated average picture level is derived using a following formula: CAPL={(APL=APL_th)/α (when 0≤APL≤APL_th); APL/α (when APL_th<APL)}(when CAPL>100%, CAPL=100%), where CAPL is the compensated average picture level, APL is the average picture level, APL_th is a threshold value of the average picture level, and α is the compensation value.

In one embodiment, the peak luminance control portion derives the IR variation amount for each column direction to calculate the maximum IR variation amount, or derives the IR variation amount for each column unit formed with two or more neighboring columns to calculate the maximum IR variation amount.

In one embodiment, the peak luminance of the picture decreases as the compensated average picture level increases.

In one embodiment, the light emitting element includes: a first electrode having a reflective property; an organic light emitting layer being on the first electrode; and a second electrode being on the organic light emitting layer and having a transparent property.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting display device, comprising:
a display panel includes a plurality of sub-pixels arranged in a plurality of column lines and a power line, wherein each of the plurality of sub-pixels is supplied with a first power voltage and a second power voltage and includes a light emitting diode, wherein the power line extends along a column line direction and transfers the first power voltage; and
a peak luminance control circuit which derives a compensation value that is adjusted according to a maximum voltage variation amount of voltage variation amounts in the column line direction for a picture input thereto, which applies the compensation value to an average picture level of the picture to derive a compensated average picture level, and which controls a peak luminance of the picture according to the compensated average picture level,
wherein the voltage variation amount includes a voltage reduction amount for the first power voltage and a voltage rise amount for the second power voltage, and
wherein the peak luminance control circuit derives the voltage variation amount for each column line to calculate the maximum voltage variation amount or derives the voltage variation amount for each column unit formed with two or more neighboring column lines to calculate the maximum voltage variation amount.

2. The organic light emitting display device of claim 1, wherein the peak luminance control circuit includes:
an average picture level calculation portion which calculates the average picture level of he picture;
a voltage variation amount derivation portion which derives voltage variation amounts of the plurality of column lines for the picture,
a compensation value derivation portion which derives the compensation value that is adjusted according to the maximum voltage variation amount of the voltage variation amounts of the plurality of column lines;
an average picture level compensation portion which applies the compensation value to the average picture level to derive the compensated average picture level; and
a peak luminance calculation portion which calculates the peak luminance of the picture according to the compensated average picture level.

3. The organic light emitting display device of claim 1, wherein the peak luminance control circuit includes a gamma source voltage generation portion which generates a high-potential gamma source voltage corresponding to the peak luminance;
the display device further comprising: a gamma voltage circuit which generates a plurality of gamma voltages corresponding to the high-potential gamma source voltage using the high-potential gamma source voltage.

4. The organic light emitting display device of claim 1, wherein the compensation value is set such that the compensated average picture level has an increasing trend as the maximum voltage variation amount increases.

5. The organic light emitting display device of claim 1, wherein the compensation value is set such that the compensation value have a decreasing trend as the maximum voltage variation amount increases,
wherein an upper limit of the compensation value is 1, and a lower limit of the compensation value is equal to or greater than 0.5 and less than 1.

6. The organic light emitting display device of claim 5, wherein the compensated average picture level is derived using a following formula: CAPL={(APL=APL_th)/α (when 0≤APL≤APL_th); APL/α (when APL_th<APL)} (when CAPL>100%, CAPL=100%),
where CAPL is the compensated average picture level, APL is the average picture level, APL_th is a threshold value of the average picture level, and α is the compensation value.

7. The organic light emitting display device of claim 1, wherein the peak luminance of the picture decreases as the compensated average picture level increases.

8. The organic light emitting display device of claim 1, wherein the light emitting diode includes:
a first electrode which is on a substrate and has a reflective property;
an organic light emitting layer which is on the first electrode and emits at least one of a red, green or blue light output from its sub-pixel; and
a second electrode which is on the organic light emitting layer and has a transparent property.

9. The organic light emitting display device of claim 8, wherein the organic light emitting layer is configured to be formed using a soluble process.

10. A device, comprising:
a plurality of sub-pixels in a display panel, wherein each of the plurality of subpixels is supplied with a first power voltage and a second power voltage, each of the plurality of sub-pixels include:
a light emitting element having a first terminal and a second terminal;
a first resistor, the first resistor connected to the first terminal of the light emitting element;
a second resistor, the second resistor connected to the second terminal of the light emitting element;
a first power source connected to the light emitting element via the first resistor, the first power source supplying the first power voltage to the light emitting element;
a second power source connected to the light emitting element via the second resistor, the second power source supplying the second power voltage to the light emitting element; and
a power line connecting the first power source to the light emitting element, the power line arranged along a column line direction of the display panel, wherein the power line includes the first resistor and transfers the first power voltage to the light emitting element via the first resistor; and
a peak luminance control circuit connected to the plurality of sub-pixels, the peak luminance control circuit configured to:
derive a compensation value that is adjusted according to a maximum voltage variation amount of voltage variation amounts in the column line direction for a picture input thereto, wherein the voltage variation amount includes a voltage drop amount of the first power voltage across the first resistor and a voltage rise amount of the second power voltage across the second resistor;

apply the compensation value to an average picture level of the picture to derive a compensated average picture level; and control a peak luminance of the picture according to the compensated average picture level, wherein the peak luminance control portion derives the voltage variation amount for each column line direction to calculate the maximum voltage variation amount, or derives the voltage variation amount for each column unit formed with two or more neighboring columns to calculate the maximum voltage variation amount.

11. The device of claim 10, wherein the second power source is a low-potential power voltage.

12. The device of claim 11, wherein the peak luminance control circuit includes:

an average picture level calculation portion which calculates the average picture level of the picture;

a voltage variation amount derivation portion which derives voltage variation amounts of the plurality of column direction line directions for the picture;

a compensation value derivation portion which derives the compensation value that is adjusted according to the maximum voltage variation amount of the voltage variation amounts of the plurality of column line directions:

an average picture level compensation portion which applies the compensation value to the average picture level to derive the compensated average picture level; and a peak luminance calculation portion which calculates the peak luminance of the picture according to the compensated average picture level.

13. The device of claim 10, wherein the peak luminance control circuit includes a gamma source voltage generation portion which generates a high-potential gamma source voltage corresponding to the peak luminance; the device further comprising: a gamma voltage circuit which generates a plurality of gamma voltages corresponding to the high-potential gamma source voltage using the high-potential gamma source voltage.

14. The device of claim 10, wherein the compensation value is set such that the compensated average picture level has an increasing trend as the maximum voltage variation amount increases.

15. The device of claim 10, wherein the compensation value is set such that the compensation value have a decreasing trend as the maximum voltage variation amount increases, wherein an upper limit of the compensation value is 1, and a lower limit of the compensation value is equal to or greater than 0.5 and less than 1.

16. The device of claim 15, wherein the compensated average picture level is derived using a following formula: $CAPL=\{(APL=APL\_th)/\alpha$ (when $0 \leq APL \leq APL\_th$); $APL/\alpha$ (when $APL\_th<APL)\}$(when $CAPL>100\%$, $CAPL=100\%$), wherein CAPL is the compensated average picture level, APL is the average picture level, APL_th is a threshold value of the average picture level, and $\alpha$ is the compensation value.

17. The device of claim 10, wherein the peak luminance of the picture decreases as the compensated average picture level increases.

18. The device of claim 10, wherein the light emitting element includes:

a first electrode having a reflective property;

an organic light emitting layer being on the first electrode; and a second electrode being on the organic light emitting layer and having a transparent property.

* * * * *

UNITED STATES PATENT AND TRADEMARK OFFICE
CERTIFICATE OF CORRECTION

| | | |
|---|---|---|
| PATENT NO. | : 11,030,957 B2 | Page 1 of 1 |
| APPLICATION NO. | : 16/566633 | |
| DATED | : June 8, 2021 | |
| INVENTOR(S) | : Sang-Kyu Kim | |

It is certified that error appears in the above-identified patent and that said Letters Patent is hereby corrected as shown below:

In the Claims

<u>Column 17, Claim 12, Line 14</u>:
"The device of claim 11, wherein"
Should read:
--The device of claim 10, wherein--.

Signed and Sealed this
Third Day of May, 2022

Katherine Kelly Vidal
*Director of the United States Patent and Trademark Office*